(12) United States Patent
Freitag et al.

(10) Patent No.: US 9,099,120 B1
(45) Date of Patent: Aug. 4, 2015

(54) INTERLAYER COUPLING FIELD CONTROL IN TUNNELING MAGNETORESISTIVE READ HEADS

(71) Applicant: HGST Netherlands B.V., Amsterdam (NL)

(72) Inventors: James Mac Freitag, Sunnyvale, CA (US); Zheng Gao, San Jose, CA (US)

(73) Assignee: HGST NETHERLANDS, B.V., Amsterdam (NL)

( * ) Notice: Subject to any disclaimer, the term of this patent is extended or adjusted under 35 U.S.C. 154(b) by 0 days.

(21) Appl. No.: 14/248,970

(22) Filed: Apr. 9, 2014

(51) Int. Cl.
  *G11B 5/39* (2006.01)
(52) U.S. Cl.
  CPC .................................... *G11B 5/39* (2013.01)
(58) Field of Classification Search
  CPC ....... G11B 5/39; G11B 5/3929; G11B 5/3932
  USPC .................. 360/324.11, 324.12, 324.1, 324.2
  See application file for complete search history.

(56) References Cited

U.S. PATENT DOCUMENTS

| | | | | |
|---|---|---|---|---|
| 5,508,867 | A * | 4/1996 | Cain et al. | 360/324.11 |
| 6,201,673 | B1 | 3/2001 | Rottmayer et al. | |
| 7,268,979 | B2 | 9/2007 | Gill | |
| 7,324,310 | B2 | 1/2008 | Gill | |
| 7,733,613 | B2 | 6/2010 | Aono | |
| 7,973,349 | B2 | 7/2011 | Huai et al. | |
| 8,399,941 | B2 | 3/2013 | Apalkov et al. | |
| 8,557,407 | B2 | 10/2013 | Zhao et al. | |
| 2003/0011943 | A1* | 1/2003 | Webb et al. | 360/324.1 |
| 2003/0137780 | A1* | 7/2003 | Fontana et al. | 360/324.2 |
| 2003/0137781 | A1* | 7/2003 | Carey et al. | 360/324.2 |
| 2003/0137782 | A1* | 7/2003 | Ho et al. | 360/324.2 |
| 2003/0179507 | A1* | 9/2003 | Freitag et al. | 360/322 |
| 2003/0179509 | A1* | 9/2003 | Pinarbasi | 360/322 |
| 2006/0034013 | A1* | 2/2006 | Kato et al. | 360/128 |
| 2006/0193089 | A1* | 8/2006 | Li et al. | 360/324.11 |
| 2006/0285248 | A1* | 12/2006 | Pust et al. | 360/128 |
| 2007/0014054 | A1* | 1/2007 | Zhang et al. | 360/324.12 |
| 2007/0035881 | A1* | 2/2007 | Burbank et al. | 360/234.3 |
| 2009/0021870 | A1 | 1/2009 | Pinarbasi | |
| 2009/0251828 | A1* | 10/2009 | Schreck et al. | 360/319 |
| 2009/0316302 | A1* | 12/2009 | Aoki | 360/234.3 |
| 2010/0157477 | A1* | 6/2010 | Morinaga et al. | 360/125.12 |
| 2010/0226044 | A1* | 9/2010 | Iwase | 360/234.3 |
| 2010/0265618 | A1* | 10/2010 | Boutaghou et al. | 360/234.3 |
| 2011/0235217 | A1* | 9/2011 | Chen et al. | 360/324.2 |
| 2012/0127602 | A1* | 5/2012 | Li et al. | 360/75 |
| 2012/0205758 | A1 | 8/2012 | Jan et al. | |
| 2012/0261777 | A1* | 10/2012 | Shukh | 257/421 |
| 2012/0300334 | A1* | 11/2012 | Hsiao et al. | 360/59 |
| 2013/0248355 | A1* | 9/2013 | Ohsawa et al. | 204/192.34 |
| 2014/0035572 | A1* | 2/2014 | Karr et al. | 324/252 |
| 2014/0340791 | A1* | 11/2014 | Braganca et al. | 360/234.4 |

OTHER PUBLICATIONS

D.H. Mosca et al.: "Oscillatory Interlayer Coupling and Giant Magnetoresistance in Co/Cu Multilayers"; Journal of Magnetism and Magnetic Materials, vol. 94, Issues 1-2, Mar. 1999.

* cited by examiner

*Primary Examiner* — Allen T Cao
(74) *Attorney, Agent, or Firm* — Patterson & Sheridan, LLP

(57) ABSTRACT

The embodiments generally relate to a read head in a magnetic recording head. The read head utilizes a sensor structure having a pinned magnetic structure with a magnetic field, a barrier layer disposed on top of the pinned magnetic structure, a free layer disposed on top of the barrier layer, and an interlayer coupling field canceling layer disposed on top of the free layer. The interlayer coupling field canceling layer has a cancelling magnetic field pinned anti-parallel the magnetic field of the pinned magnetic structure.

22 Claims, 4 Drawing Sheets

INTERLAYER COUPLING FIELD CONTROL IN TUNNELING MAGNETORESISTIVE READ HEADS

BACKGROUND OF THE INVENTION

1. Field of the Invention

Embodiments disclosed herein generally relate to a magnetic read head for use in a hard disk drive.

2. Description of the Related Art

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider towards the surface of the disk when the disk is not rotating but, when the disk rotates, air is swirled by the rotating disk adjacent to a media facing surface (MFS), such as an air bearing surface (ABS) of the slider causing the slider to ride on an air bearing a slight distance from the surface of the rotating disk. When the slider rides on the air bearing, the write and read heads are employed for writing magnetic transitions corresponding to host data. The read and write heads are connected to a signal processing circuitry that operates according to a computer program to implement the writing and reading functions.

Decreasing the size of devices has necessitated the reduction in the space available for hard disk drives while at the same the requirements for larger capacity disk drives have continued to grow. As the capacities of disk drives grow, the areal recording density has increased to provide a greater volume of data to be stored in the same physical space. Increasing the areal recording density of next generation heads requires shrinking the size of the corresponding read and increasing the signal to noise ratio of the read head.

However, increasing the signal to noise ratio of the read head necessitates the reduction of the resistance-area RA product while keeping the magnetoresistance ratio high in a small RA region. For tunnel junction devices, the magnetic field interlayer coupling ($H_{int}$) increases in a positive direction exponentially with the decrease in the resistance area (RA) of the barrier tunnel junction. This is due to magnetostatic coupling inherent to thin barrier tunnel junctions. Since the interlayer coupling field biases the free layer in the pinned layer direction, attaining a stable longitudinal bias state relative to the ABS requires a large stabilization field (from hard or soft bias layers) which increases the stiffness of the sensor and decreases its signal output.

Conventionally, this control is provided by increasing the hard/soft bias field acting on the free layer, which reduces the sensitivity of the sensor. Currently, there are no known efficient means for providing a means to reduce the $H_{int}$ while still maintaining the low RA and the high magnetoresistance ratio needed in the higher areal recording densities of next generation devices.

Therefore there is a need in the art for a magnetic read head with a small $H_{int}$, for the use with increased areal recording densities.

SUMMARY OF THE INVENTION

The embodiments disclosed herein generally relate to a read head in a magnetic recording head. In one embodiment, a sensor structure comprises: a pinned magnetic structure having a magnetic field; a barrier layer disposed on top of the pinned magnetic structure; a free layer disposed on top of the barrier layer; and an interlayer coupling field canceling layer disposed on top of the free layer, wherein the interlayer coupling field canceling layer has a cancelling magnetic field pinned in a direction anti-parallel to the magnetic field of the pinned magnetic structure. It is to be understood that while description is made herein with reference to a hard disk drive, the embodiments disclosed herein are not limited to hard disk drives. Rather, the read sensors disclosed herein can be used on the magnetic media of: tape magnetic storage devices, hard disk drives, and hybrid hard drives (mixture of flash media and magnetic disk media).

In another embodiment, a magnetic read head comprises: a bottom shield; a pinned magnetic structure disposed over the bottom shield wherein the pinned magnetic structure comprises: AFM seed layers, a first antiferromagnetic layer disposed on the seed layers to promote the optimal AFM morphology, a pinned magnetic structure disposed on the first antiferromagnetic layer, where the pinned magnetic structure comprises a magnetic layer or a first magnetic layer, a nonmagnetic coupling layer and a second magnetic layer disposed on the nonmagnetic coupling layer. The magnetic read head further comprises: a barrier layer disposed on the pinned magnetic structure; a free magnetic layer disposed on the spacer layer; a spacer layer disposed on the free magnetic layer; a control layer magnetically biased in a direction opposite the pinned magnetic structure; a second antiferromagnetic layer disposed on the control layer and coupled to the control layer, wherein the second antiferromagnetic layer is biased in the same direction as the first antiferromagnetic layer; and a top shield disposed on the second antiferromagnetic layer.

In yet another embodiment, a magnetic read head comprises: a top shield; a first antiferromagnetic layer disposed under the top shield, a pinned magnetic structure disposed under the first antiferromagnetic layer. The pinned magnetic structure comprises: a pinned magnetic layer disposed under the first antiferromagnetic layer or a first pinned magnetic layer disposed under the first antiferromagnetic layer, a nonmagnetic coupling layer disposed under the first pinned layer, and a second magnetic layer disposed on the nonmagnetic coupling layer. The magnetic read head further comprises: a barrier layer disposed under the pinned magnetic layer; a free magnetic layer disposed under the spacer layer; a spacer layer disposed under the free magnetic layer; a control layer magnetically biased in a direction opposite the pinned magnetic structure; a second antiferromagnetic layer disposed under the control layer and coupled to the control layer, wherein the second antiferromagnetic layer is biased in the same direction as the first antiferromagnetic layer; and a bottom shield disposed under the second antiferromagnetic layer.

In yet another embodiment, a sensor structure comprises: a simple pinned magnetic structure having a magnetic field. The simple pinned magnetic structure comprises: a first antiferromagnetic layer biased parallel the interlayer coupling field canceling structure; a first pinned magnetic layer disposed on top of the first antiferromagnetic layer; and a barrier layer disposed on top of the pinned magnetic structure. The sensor structure further comprises: a free layer disposed on top of the barrier layer; a second antiferromagnetic layer disposed on top of the control layer and coupled to the control layer, wherein the second antiferromagnetic layer is magnetically biased in the same direction as the first antiferromagnetic layer; and an interlayer coupling field canceling structure disposed on top of the free layer. The interlayer coupling field canceling structure comprises: a spacer layer disposed on top of the free layer; and a control layer magnetically biased anti-parallel the magnetic field of the pinned magnetic structure and wherein the interlayer coupling field canceling structure has a cancelling magnetic field pinned anti-parallel the magnetic field of the pinned magnetic structure.

BRIEF DESCRIPTION OF THE DRAWINGS

So that the manner in which the above recited features can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Figure 1:
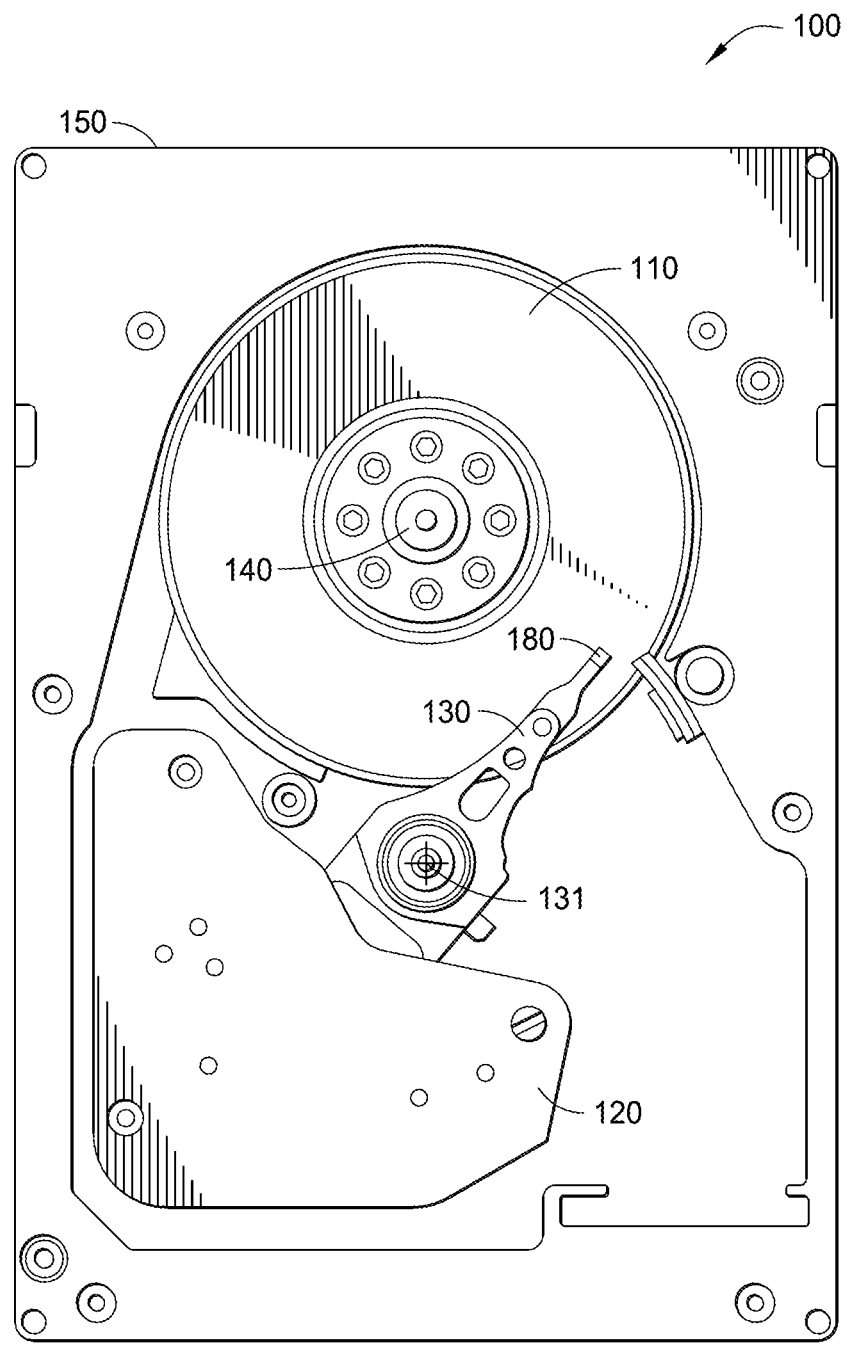
FIG. 1 illustrates an exemplary magnetic disk drive, according to an embodiment of the invention.

FIG. 1 illustrates a top view of an exemplary hard disk drive (HDD) 100, according to an embodiment of the invention. As illustrated, HDD 100 may include one or more magnetic disks 110, an actuator 120, actuator arms 130 associated with each of the magnetic disks 110, and a spindle motor 140 affixed in a chassis 150. The one or more magnetic disks 110 may be vertically arranged and coupled with the spindle motor 140.

Magnetic disks 110 may include circular tracks of data on both the top and bottom surfaces of the magnetic disk 110. A magnetic read/write head 180 mounted on a slider may be positioned on a track. As each magnetic disk 110 spins, data may be written on to, and/or read from, the data track. Magnetic read/write head 180 may be coupled to an actuator arm 130 as illustrated in FIG. 1. Actuator arm 130 may be configured to swivel around actuator axis 131 to place magnetic read/write head 180 on a particular data track.

Figure 2:
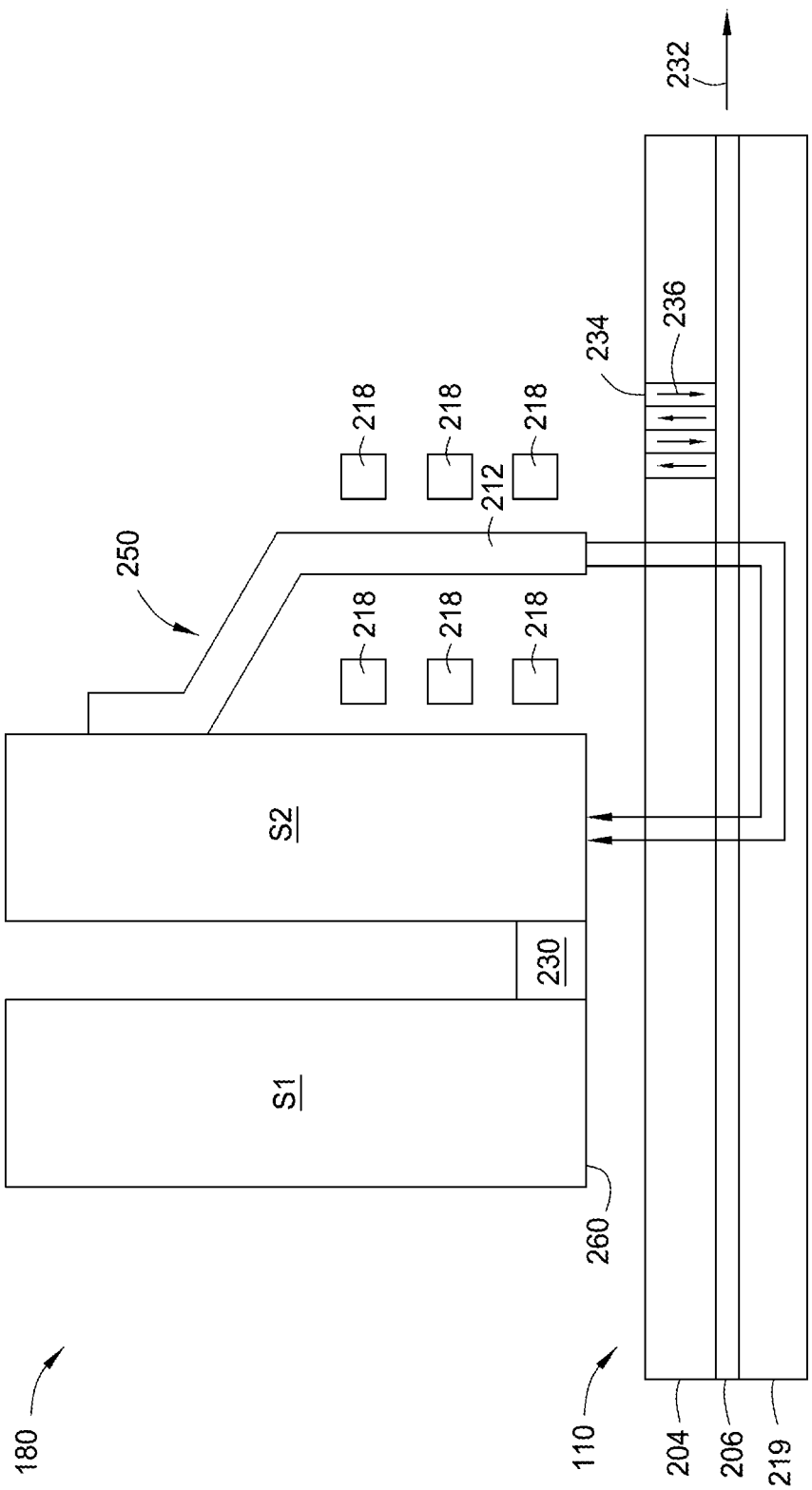
FIG. 2 is a side view of a read/write head and magnetic disk of the disk drive of FIG. 1, according to one embodiment of the invention.

FIG. 2 is a fragmented, cross-sectional side view through the center of the magnetic read/write head 180 facing the magnetic disk 110. The magnetic read/write head 180 and magnetic disk 110 may correspond to the magnetic read/write head 180 and magnetic disk 110, shown in FIG. 1.

In some embodiments, the magnetic disk 110 may be a "dual-layer" medium that includes a perpendicular magnetic data recording layer (RL) 204 on a "soft" or relatively low coercivity magnetically permeable under-layer (PL) 206 disposed atop a non-magnetic material 219. The RL 204 is illustrated with perpendicularly recorded or magnetized regions 234, with adjacent regions having magnetization directions, as represented by the arrows 236 located in the RL 204.

The magnetic read/write head 180 includes an MFS 260, such as an ABS, such that its ABS is facing the magnetic disk 110. The magnetic read/write head 180 also includes a magnetic write head 250 and a magnetic read head 230. The magnetic read head 230 is disposed between a bottom shield S1 and a top shield S2. Additionally, the top shield S2 may be disposed between the magnetic write head 250 and the magnetic read head 230. The write head 250 includes a magnetic circuit made up of a main pole 212 and a thin film coil 218 shown in the section embedded in the non-magnetic material 219.

In FIG. 2, the magnetic disk 110 moves past the magnetic read/write head 180 in the direction indicated by the arrow 232. The magnetic write head 250 writes bits of information in the adjacent magnetized regions 234 for recording data on the magnetic disk 110. The magnetized bits are detectable by the read head 230 which senses the recorded (magnetized) bits.

Figure 3A:
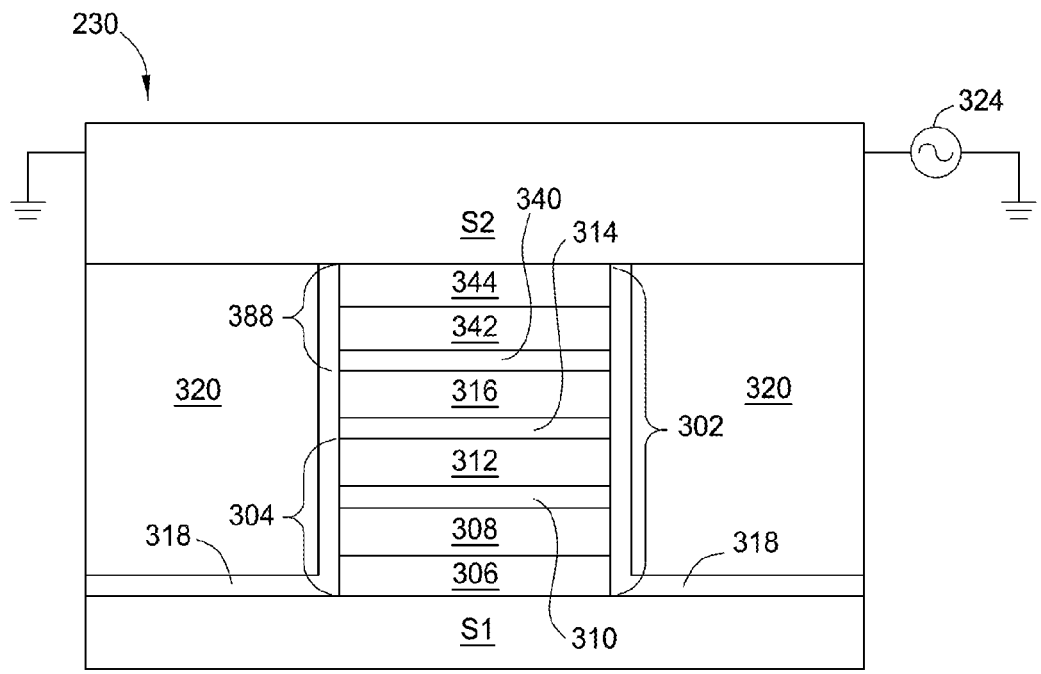
FIGS. 3A-3B are schematic illustrations of read heads according to embodiments of the invention.
Figure 3B:
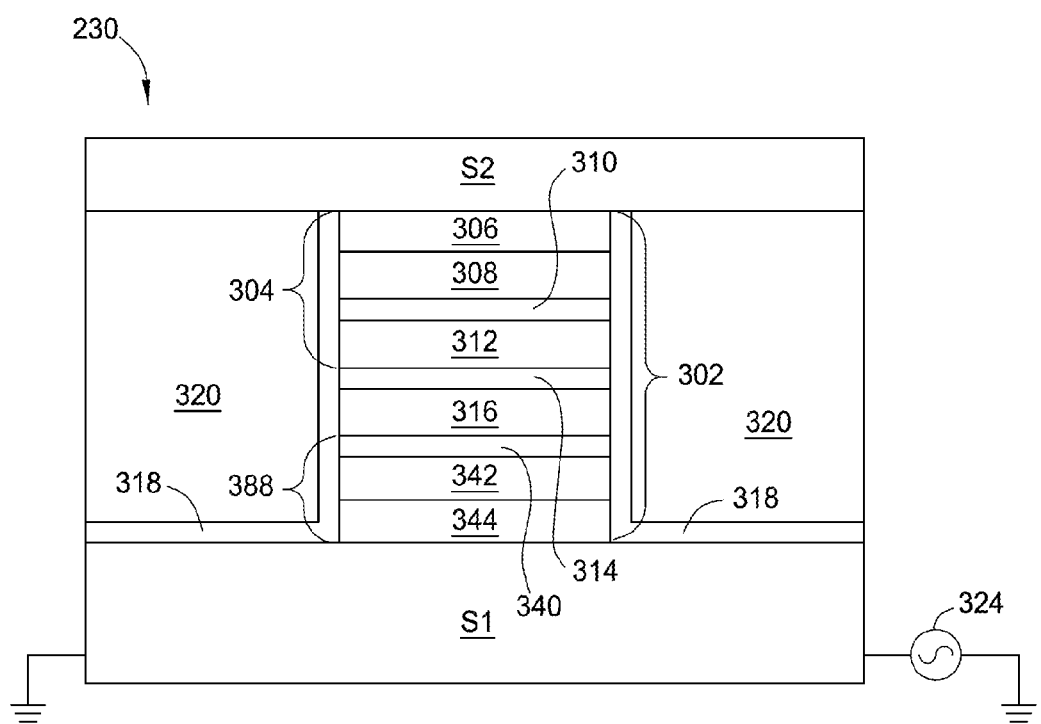

FIGS. 3A-3B are schematic illustrations of the read heads 230, 230' according to embodiments of the invention. FIG. 3A illustrates a bottom pinned read head 230 according to one embodiment. FIG. 3B illustrates a top pinned read head 230' according to a second embodiment. In both FIGS. 3A and 3B, a sensor structure 302, having a pinned magnetic structure 304, is disposed between the bottom shield S1 and the top shield S2. The following discussion will be in reference to FIG. 3A but is equally germane to FIG. 3B.

In FIG. 3A, the bottom shield S1 may comprise a ferromagnetic material such as nickel (Ni), iron (Fe), cobalt (Co), nickel-iron alloy (NiFe), nickel-iron-cobalt alloy (NiFeCo), nickel-cobalt alloy (NiCo), cobalt-iron alloy (CoFe), combinations thereof, or other suitable materials. The sensor structure 302 is disposed on the bottom shield S1. The sensor structure 302 may optionally include a seed layer (not shown) disposed on the bottom shield S1. The seed layer may comprise ruthenium (Ru), tantalum (Ta), combinations thereof, or other suitable material.

The bottom pinned magnetic structure 304 comprises an antiferromagnetic layer (AFM) 306, a pinned magnetic layer 308, a nonmagnetic coupling layer 310, and a reference magnetic layer 312. Alternatively, the pinned magnetic structure 304 may comprise a single magnetic layer comprising a ferromagnetic material pinned by an antiferromagnetic layer.

The AFM 306 may be annealed in an aligning magnetic field to pin the orientation of the magnetic field of the AFM 306. The AFM 306 may comprise platinum (Pt), iridium (Ir), rhodium (Rh), nickel (Ni), iron (Fe), magnesium (Mn), or combinations thereof such as platinum-manganese (PtMn), PtPdMn, NiMn or Iridium-Manganese (IrMn). In one embodiment, the AFM 306 is comprised of IrMn and has a thickness of between about 20 Angstroms and about 80 Angstroms such as about 60 Angstroms.

The pinned magnetic layer 308 is deposited on the antiferromagnetic layer 306. The pinned magnetic layer 308 may comprise one or more magnetic materials such as, for example Co, NiFe, CoFe, CoFeB, or diluted magnetic alloys. In one embodiment, several magnetic materials may be layered to form the pinned magnetic layer 308. For example, the pinned magnetic layer 308 may be formed from a CoFe layer having a thickness between about 10 Angstroms and about 30 Angstroms such as about 16 Angstroms, disposed atop a second Co layer having a thickness between about 2 Angstroms and about 10 Angstroms such as about 5 Angstroms.

The nonmagnetic coupling layer 310 is deposited on the pinned magnetic layer 308. The magnetic coupling layer 310 may comprise Ru, Ir, Cr, Rh, combinations thereof, or other suitable materials. In one embodiment, the nonmagnetic coupling layer 310 may be formed from Ru having a thickness between about 2 Angstroms and about 10 Angstroms such as about 4.2 Angstroms.

The reference magnetic layer 312 may optionally be deposited on the nonmagnetic coupling layer 310. The inclusion of the reference magnetic layer 312 on the nonmagnetic coupling layer 310 may reverse the magnetic field orientation for the pinned magnetic structure 304. Therefore, the reference magnetic layer 312 may be used to determine the pinning direction of the bottom pinned magnetic structure 304. For example, the bottom pinned magnetic structure 304 includes reference magnetic layer 312 and the pinning direction of the bottom pinned magnetic structure 304 is anti-parallel to the antiferromagnetic layer (AFM) 306. In another example, the bottom pinned magnetic structure 304 does not include a reference magnetic layer 312 and nonmagnetic coupling layer 310. In this example, the pinning direction of the bottom pinned magnetic structure 304 is parallel to the antiferromagnetic layer (AFM) 306.

The reference magnetic layer 312 may comprise one or more magnetic materials such as Co, CoFeBTa, NiFe, CoFe, CoFeB, or diluted magnetic alloys. In one embodiment, several magnetic alloys may be layered to form the reference magnetic layer 312.

A barrier layer 314 is deposited on top of the reference magnetic layer 312 of the sensor structure 302. As the barrier layer 314 becomes thinner, the magnetic interlayer coupling between adjacent layers increases. In the case of a TMR sensor, the barrier layer 314 may be formed from an insulating material such as Magnesium Oxide (MgO), Titanium Oxide ($TiO_2$), alumina ($Al_2O_3$), or other suitable materials. In one embodiment, the barrier layer 314 comprises MgO with a thickness between about 2 Angstroms and about 15 Angstroms, such as about 10 Angstroms. In the case of a GMR sensor, the barrier layer 314 may be formed from a conductive material such as Cu, Ag, or AgSn.

A free magnetic layer 316 is deposited on the barrier layer 314. The free magnetic layer 316 may comprise one or more of Co, Fe, B, CoB, CoFe, CoFeB, NiFe, CoHf, or other suitable material. The free magnetic layer 316 may comprise a single layer of magnetic material or multiple layers.

Thinner barrier layers 314 require strong longitudinal stabilization bias for asymmetry control of the free magnetic layer 316 which in turn reduces sensitivity. The strong longitudinal stabilization and strong $H_{int}$ requires a large external force to move the free magnetic layer 316 out of parallel with the pinned magnetic structure 304, thereby decreasing the sensitivity and signal output of the sensor.

An interlayer coupling field canceling structure 388 is disposed on top of the free magnetic layer 316 to control the $H_{int}$. The interlayer coupling field canceling structure 388 may generate a positive or negative $H_{int}$ which opens new read head 180 design space. The interlayer coupling field canceling structure 388 may consist of a spacer layer 340 and a control layer 342. Additionally, the interlayer coupling field canceling structure 388 may include a second AFM layer 344.

The spacer layer 340 is deposited on the free magnetic layer 316. The spacer layer 340 may comprise one or more layers of copper (Cu), chromium (Cr), Ru or other suitable non-magnetic material. Thus, the spacer layer 340 may comprise a single layer of non-magnetic material or, in other embodiments multiple layers. The spacer layer 340 may enhance or even reverse the direction of the magnetic field for adjacent layer. For instance, Ru has a strong coupling mechanism of nuclear magnetic moments, or RKKY coupling. The RKKY coupling is sinusoidal and decays with the increase in material thickness. The RKKY coupling for the Ru spacer layer flips between positive and negative values while decreasing in magnitude as the thickness of the Ru material layer increases. For example, a 6 Angstroms thick Ru spacer layer 340 may have a strong positive bias while an 8 Angstrom thick layer of the same material will have a strong negative bias. Thus, selecting an appropriate material and thickness for the spacer layer 340 may in effect tune the bias on the free magnetic layer 316. In one embodiment, spacer layer 340 is comprised of a Cu layer with a thickness between about 5 Angstroms and about 15 Angstroms, such as about 7.5 Angstroms deposed atop a Ru layer with a thickness between about 5 Angstroms and about 15 Angstroms, such as about 7.5 Angstroms.

In a conventional read head, the free magnetic layer 316 tends to align with the pinned magnetic structure 304 when the barrier layer 314 is thinned due to the increase in $H_{int}$. The large $H_{int}$ requires a large force to move the free magnetic layer 316 out of parallel. The control layer 342 is deposited on the spacer layer 340 to counter the large $H_{int}$. The control layer 342 may be directly coupled to the free magnetic layer 316 or coupled through the spacer layer 340. Thus, external magnetic forces may flip the free magnetic layer 316 in an orientation parallel or anti-parallel to the pinned magnetic structure 304 with equal ease, making the free magnetic layer 316 more responsive to outside influences and less stiff.

The control layer 342 may be formed from one or more of Co, Fe, CoFe, NiFe, or other suitable material. In some embodiments, the control layer 342 may be formed from a single layer of magnetic material. In other embodiments, the control layer 342 may be formed from multiple layers. In one embodiment, the control layer 342 is comprised of a Co layer with a thickness between about 2 Angstroms and about 10 Angstroms, such as about 5 Angstroms, deposed atop a NiFe layer with a thickness between about 25 Angstroms and about 40 Angstroms, such as about 30 Angstroms, deposed atop a second Co layer with a thickness between about 2 Angstroms and about 10 Angstroms such as about 5 Angstroms.

The second AFM layer 344 is deposited on the control layer 342. The second AFM 344 may be same or different material and thickness as that of the AFM 306. The second AFM 344 may be annealed in an aligning magnetic field to pin the orientation of the magnetic field of the second AFM 344. The second AFM 344 is coupled to the control layer 342 and may determine the direction of the magnetic bias for the control layer 342. The orientation of the magnetic field for the second AFM 344 may be parallel to the orientation of the magnetic field for the AFM 306 of the pinned magnetic structure 304. Therefore, the AFM 306 and second AFM 344 of the pinned magnetic structure 304 may be annealed together at the same time in a single step.

The second AFM 344 may be formed from platinum (Pt), iridium (Ir), rhodium (Rh), nickel (Ni), iron (Fe), magnesium (Mn), or combinations thereof such as platinum-manganese (PtMn), PtPdMn, NiMn or Iridium-Manganese (IrMn). In one embodiment, the second AFM layer 344 is comprised of IrMn and has a thickness of between about 55 Angstroms and about 70 Angstroms such as about 60 Angstroms.

The second AFM layer 344 may "top" pin the control layer 342 to control the bias of the free magnetic layer 316. Thus the control layer 342 may be tuned by the spacer layer 340 to effectively balance the pinned magnetic structure 304. In one embodiment, the control layer 342 is oriented anti parallel to the reference magnetic layer 312. Therefore, the free magnetic layer 316 disposed between the reference magnetic layer 312 and the control layer 342 may be more responsive to external magnetic forces.

While not shown, a cap layer may be disposed on the second AFM layer 344. The cap layer may comprise Ru, Ta, combinations thereof, or other suitable materials. In one embodiment, the cap layer may be formed from Ru having a thickness between about 20 Angstroms and about 50 Angstroms, such as about 40 Angstroms, disposed on a Ta layer having a thickness between about 15 Angstroms and about 30 Angstroms, such as about 20 Angstroms, disposed on a second Ru layer having a thickness between about 15 Angstroms and about 30 Angstroms, such as about 20 Angstroms.

Bordering the sensor structure 302 may be a first insulating layer 318 that is disposed on the first shield layer S1 as well as the sidewalls of the sensor structure 302, such as the pinned magnetic structure 304, the barrier layer 314, the free magnetic layer 316, the spacer layer 340, the control layer 342 and the second AFM layer 344. The first insulating layer 318 may comprise an insulating material such as aluminum oxide or silicon nitride. The bias layer 320 may comprise a single material or laminated magnetic materials such as CoPt, FePt, high moment CoFe or NiFe. Once the bias layer 320 is deposited, a bias capping structure, not shown, may be deposited over the bias layer 320. In one embodiment, the bias capping structure may comprise a multiple layered structure comprising one or more combinations of a tantalum layer, an iridium layer, a chromium layer, a titanium layer and a ruthenium layer.

The top shield S2 may comprise a ferromagnetic material such as nickel (Ni), iron (Fe), cobalt (Co), nickel-iron alloy (NiFe), nickel-iron-cobalt alloy (NiFeCo), nickel-cobalt alloy (NiCo), cobalt-iron alloy (CoFe), combinations thereof, or other suitable materials. The top shield S2 may be disposed on the sensor structure 302, the first insulating layer 318 and the bias layer 320. In the embodiment shown in FIG. 3A, current may be applied to the top shield S2 from a power source 324 and flow from the top shield to the bottom shield through the sensor 302 or vice-versa.

The sensor structure 302 of the read head 230 shown in FIG. 3A is capable of generating a positive or negative $H_{int}$ with a RA/TMR of about 0.8 Ohms micron/88%. Further optimization may be realized through adjustments to the thickness of the free magnetic layer 316 and/or the control layer 342. Strong control of the $H_{int}$ may be achieved by varying the material and thickness of the spacer layer 340 to adjust the strength and direction for the magnetic field. This allows for thinning of the barrier layer 314 without strongly biasing the free magnetic layer 316.

FIG. 3B shows a top pinned read head 230'. The sensor structure 302 for the top pinned read head 230' is similar to that of the bottom pinned read head 230. However, the orientation of the sensor structure 302 of the top pinned read head 230' may be inverted from that of the bottom pinned read head 230.

The pinned magnetic structure 304 may comprise a single pinned magnetic layer comprising a ferromagnetic layer. The pinned magnetic structure 304 is antiferromagnetically disposed under the top shield S2 and coupled thereto. The top pinned magnetic structure 304 comprises the antiferromagnetic layer (AFM) 306, the pinned magnetic layer 308 and the nonmagnetic coupling layer 310 disposed under the top shield S2. The top pinned magnetic structure 304 may additionally comprise the reference magnetic layer 312 disposed under the nonmagnetic coupling layer 310.

The barrier layer 314 is disposed below the pinned magnetic structure 304. The free magnetic layer 316 is deposed below the barrier layer 314. As the barrier layer 314 thickness decreases, positive $H_{int}$ increases exponentially and biases the free magnetic layer 316 to parallel the pinned magnetic structure 304 due to magnetostatic coupling inherent to thin barrier tunnel junctions.

Increasing the hard/soft bias field generates a larger negative magnetostriction in free magnetic layer 316. This reduces the sensitivity of the sensor. The free magnetic layer 316 may have the spacer layer 340 and the control layer 342 disposed below it. Adjusting the thickness and material of the spacer layer 340, as discussed supra, may tune the $H_{int}$ in either a positive or negative direction as warranted by the sensor structure 302. The spacer layer 340 and control layer 342 may be configured to reduce the $H_{int}$ and relax the biasing of the free magnetic layer 316. Thus, the spacer layer 340 and control layer 342 improves the response and performance of the read head 230'.

The second AFM layer 344 may be disposed below the control layer 342 and bias the control layer. The second AFM 344 is coupled to the control layer 342 and may determine the direction of the magnetic bias for the control layer 342. The second AFM 344 may be annealed in an aligning magnetic field to pin the orientation of the magnetic field of the second AFM 344 to be parallel to the orientation of the magnetic field for the AFM 306. Therefore, the AFM 306 and second AFM 344 of the pinned magnetic structure 304 may be annealed together at the same time in a single step.

The embodiments generally relate to the read head 230, 230' in the magnetic read/write head 180. An interlayer coupling field canceling structure 388 is disclosed on top of the free magnetic layer 316 in both a top-pinned and a bottom-pinned magnetic tunnel junction (MTJ). For the top-pinned MTJ, the canceling structure 388 would be below the free magnetic layer 316. For an MTJ with a synthetic anti-ferromagnetic pinned layer, the canceling structure 388 may consist of a second anti-ferromagnetic layer 344. The second anti-ferromagnetic layer 344 may be annealed and set in the same direction as the anti-ferromagnetic layer 306 in the pinned magnetic structure 304 and will naturally provide a bias field opposite to the pinned magnetic structure 304. Therefore, the canceling structure 388 opposes the interlayer coupling field ($H_{int}$). By choosing the material, thickness, and process for depositing the canceling structure 388, the pinning field can be tuned to reduce $H_{int}$. A negative $H_{int}$ may even be achieved if desired.

The weak coupling of the canceling structure 388 and the free layer 316 still allows the rotation of the free layer 316 by the external magnetic field while reading a magnetic disk 110, as shown in FIG. 1. A spacer 340 may be provided between the canceling structure 388 and the free layer 316. Various modifications to the properties of the spacer 340 may be associated with specific read head configurations in order to reduce the magnetic field interlayer coupling of the read head.

Alternatively, the canceling structure 388 may consist of a control layer 342 in contact with an anti-ferromagnetic layer 344, both layers separated from the free magnetic layer 316 by a non-magnetic spacer layer 340. For a simple pinned MTJ, the $H_{int}$ can be reduced by choosing the material and thickness of the spacer layer 340 that produces anti-ferromagnetic coupling between the free magnetic layer 316 and the canceling structure 388.

FIGS. 4A-4D graphically illustrate ferromagnetic or anti-ferromagnetic biasing of the free magnetic layer 316 for various embodiments of the spacer layer 340 in the read heads 230, 230' of FIGS. 3A and 3B. On top of the free magnetic layer, the canceling layer is deposited consisting of a spacer layer of Cu, or Ru with two different thicknesses, a ferromagnetic control layer consisting of a laminate of Co/NiFe/Co, and a second AFM layer consisting of IrMn. The full structure of the device is similar to the sensor structure 302 shown in FIG. 3A.

The graphs depicted in FIGS. 4A-4D show the relationship between magnetization (M) and field strength (H), i.e. M-H magnetic hysteresis. A vibrating sample magnetometer was used to measure the magnetization loops and interlayer coupling field (Hint). The values displayed on the Y-axis of the graphs illustrated in the FIGS. 4A-4D are magnetization (M) and have units of A NiFe equivalent while the x-axis shows the applied field strength (H) in Oersted (Oe).

Figure 4A:
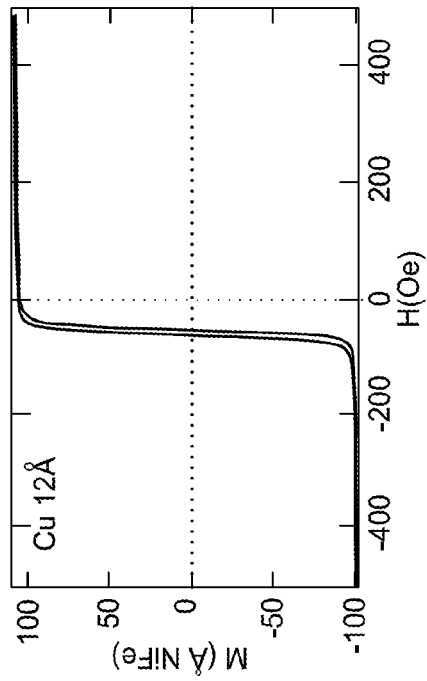
FIGS. 4A-4D graphically illustrate magnetic coupling of a free magnetic layer for various embodiments of a spacer layer shown in the read head of FIGS. 3A and 3B.

FIG. 4A illustrates a graph for a 7 angstrom thick Cu spacer layer in the sensor structure. A negative interlayer coupling field $H_{int}$ of about –68.4 Oe is attained with an RA of about 0.78 Ohms micron$^2$ and a TMR of about 86.6. TMR and RA were measured by current in plane tunneling (CIPT). The values for the 7 angstrom thick Cu spacer layer are close to the standard magnetic tunnel junction, however with a negative interlayer coupling field.

Figure 4B:
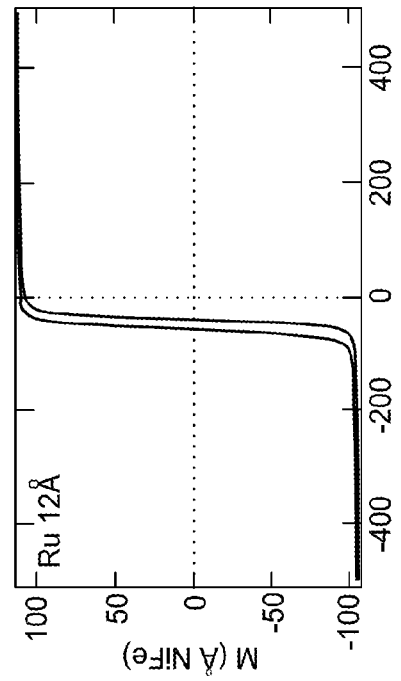

FIG. 4B illustrates a graph for a 12 angstrom thick Cu spacer layer in the sensor structure. A negative interlayer coupling field $H_{int}$ of about –69.5 Oe is attained with an RA of about 0.80 Ohms micron$^2$ and a TMR of about 88.3. The increased thickness of the 12 angstrom thick Cu spacer layer has a correlates to a corresponding increase in the negative interlayer coupling field $H_{int}$.

Figure 4C:
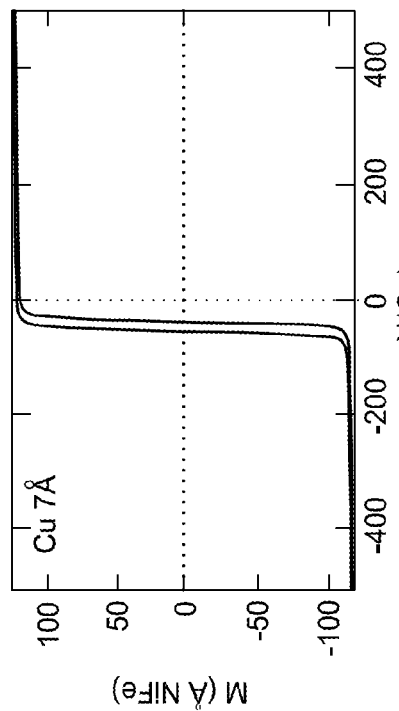

FIG. 4C illustrates a graph for a 7 angstrom thick Ru spacer layer in the sensor structure. An interlayer coupling field $H_{int}$ of about 403.7 Oe is attained with an RA of about 0.81 Ohms micron$^2$ and a TMR of about 15.8. The interlayer coupling field $H_{int}$ and the TMR of the 7 angstrom thick Ru spacer layer offers an alternative to the Cu spacer layer for variations in the sensor structure. The coupling between the free layer and the control layer with the 7 Angstrom Ru spacer is anti-ferromagnetic. Thus, the exchange field adds to the interlayer coupling field resulting in a very large positive $H_{int}$.

Figure 4D:
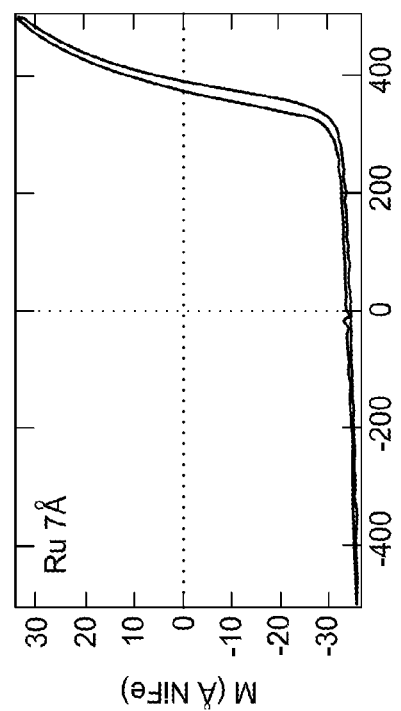

FIG. 4D illustrates a graph for a 12 angstrom thick Ru spacer layer in the sensor structure. A negative interlayer coupling field $H_{int}$ of about –66.8 Oe is attained with an RA of about 0.80 Ohms micron and a TMR of about 90.8. The 12 Angstrom Ru spacer in FIG. 4D shows a negative interlayer coupling, similar to the behavior with both Cu spacer thicknesses shown in FIGS. 4A and 4B as the coupling for the 12 Angstrom Ru spacer in FIG. 4C between the FL and CL is ferromagnetic.

While the 12 angstrom thick Ru spacer layer had a negative interlayer coupling field $H_{int}$, the 7 angstrom thick Ru spacer layer of FIG. 4C had a large positive interlayer coupling field $H_{int}$. The $H_{int}$ versus the Ru thickness may be shown as a decaying sinusoidal graph with peaks frequencies at about every 4 angstroms. Therefore a particular value for the interlayer coupling field $H_{int}$ may be selected based on the thickness of the Ru spacer layer.

Therefore, it has been shown where pinning the interlayer coupling field canceling layer in a direction anti-parallel to the pinned magnetic structure opposes the interlayer coupling field. Advantageously, the weak coupling allows rotation of the free magnetic layer in the presence of an external magnetic field. The control layer of the interlayer coupling field canceling layer can be directly coupled to the free magnetic layer or through the spacer layer such as Cu or Ru. The selection of the materials and the thickness for the spacer layer may be used to tune the parameters of the interlayer coupling field canceling layer. Thus, reducing the interlayer coupling field for the TMR devices, while increasing the signal to noise ratio (SNR) of the read head, provides an improved reading of the magnetic signal from the media.

While the foregoing is directed to exemplified embodiments, other and further embodiments of the invention may be devised without departing from the basic scope thereof, and the scope thereof is determined by the claims that follow.

What is claimed is:

1. A sensor structure, comprising
   a pinned magnetic structure having a magnetic field;
   a barrier layer disposed on top of the pinned magnetic structure;
   a free layer disposed on top of the barrier layer; and
   an interlayer coupling field canceling structure disposed on top of the free layer, wherein the interlayer coupling field canceling structure has a cancelling magnetic field pinned anti-parallel the magnetic field of the pinned magnetic structure.

2. The sensor structure of claim 1, wherein the pinned magnetic structure comprises:
   a first antiferromagnetic layer biased parallel the interlayer coupling field canceling structure;
   a first pinned magnetic layer disposed on top of the first antiferromagnetic layer;
   a nonmagnetic coupling layer disposed on top of the first pinned magnetic layer; and
   a second pinned magnetic layer disposed on top of the nonmagnetic coupling layer wherein the second pinned magnetic layer is biased anti-parallel to the interlayer coupling field canceling structure.

3. The sensor structure of claim 1 wherein the pinned magnetic structure comprises:
   a first antiferromagnetic layer biased anti-parallel the interlayer coupling field canceling structure; and
   a first pinned magnetic layer disposed on top of the first antiferromagnetic layer.

4. The sensor structure of claim 1, wherein the interlayer coupling field canceling structure comprises:
   a control layer magnetically biased anti-parallel the magnetic field of the pinned magnetic structure; and
   a second antiferromagnetic layer disposed on top of the control layer and coupled to the control layer, wherein the second antiferromagnetic layer is magnetically biased in the same direction as the first antiferromagnetic layer.

5. The sensor structure of claim 1, further comprising:
   a spacer layer disposed between the free layer and the interlayer coupling field canceling structure.

6. The sensor structure of claim 5, wherein the spacer layer is one of chromium, ruthenium, or copper.

7. The sensor structure of claim 6, wherein the spacer layer is between 5 Angstroms and 12 Angstroms thick.

8. The sensor structure of claim 1, wherein the interlayer coupling field canceling structure opposes an interlayer coupling field between the free layer and the pinned magnetic structure.

9. A magnetic read head, comprising:
a bottom shield;
a pinned magnetic structure disposed over the bottom shield wherein the pinned magnetic structure comprises:
   a first antiferromagnetic layer disposed on the bottom shield,
   a first pinned magnetic layer disposed on the first antiferromagnetic layer,
   a nonmagnetic coupling layer disposed in the first pinned magnetic layer; and
   a second pinned magnetic layer disposed on the nonmagnetic coupling layer;
a barrier layer disposed on the pinned magnetic structure;
a free magnetic layer disposed on the barrier layer;
a control layer magnetically biased in a direction opposite the pinned magnetic structure;
a second antiferromagnetic layer disposed on the control layer and coupled to the control layer, wherein the second antiferromagnetic layer is biased in the same direction as the first antiferromagnetic layer; and
a top shield disposed on the second antiferromagnetic layer.

10. The magnetic read head of claim 9, further comprising:
a spacer layer disposed on the free magnetic layer and below the control layer.

11. The magnetic read head of claim 10, wherein the spacer layer is one of chromium, ruthenium, or copper.

12. The magnetic read head of claim 10, wherein the spacer layer is between 5 Angstroms and 12 Angstroms thick.

13. The magnetic read head of claim 9, wherein the top shield is electrically coupled to a power source.

14. A magnetic read head, comprising:
a top shield;
a pinned magnetic structure disposed under the top shield wherein the pinned magnetic structure comprises:
   a first antiferromagnetic layer disposed under the top shield,
   a first pinned magnetic layer disposed under the first antiferromagnetic layer,
   a nonmagnetic coupling layer disposed under the first pinned magnetic layer; and
   a second pinned magnetic layer disposed under the nonmagnetic coupling layer;
a barrier layer disposed under the pinned magnetic structure;
a free magnetic layer disposed under the barrier layer;
a control layer magnetically biased in a direction opposite the pinned magnetic structure;
a second antiferromagnetic layer disposed under the control layer and coupled to the control layer, wherein the second antiferromagnetic layer is biased in the same direction as the first antiferromagnetic layer; and
a bottom shield disposed under the second antiferromagnetic layer.

15. The magnetic read head of claim 14, further comprising:
a spacer layer disposed under the free magnetic layer and above the control layer.

16. The magnetic read head of claim 15, wherein the spacer layer is one of chromium, ruthenium, or copper.

17. The magnetic read head of claim 16, wherein the spacer layer is between 5 Angstroms and 12 Angstroms thick.

18. The magnetic read head of claim 14, wherein the bottom shield is electrically coupled to a power source.

19. A sensor structure, comprising:
a simple pinned magnetic structure having a magnetic field, wherein the simple pinned magnetic structure comprises:
   a first antiferromagnetic layer biased parallel the interlayer coupling field canceling structure;
   a first pinned magnetic layer disposed on top of the first antiferromagnetic layer; and
a barrier layer disposed on top of the pinned magnetic structure;
a free layer disposed on top of the barrier layer;
an interlayer coupling field canceling structure disposed on top of the free layer, wherein the interlayer coupling field canceling structure comprises:
   a spacer layer disposed on top of the free layer; and
   a control layer magnetically biased anti-parallel the magnetic field of the pinned magnetic structure; and
   a second antiferromagnetic layer disposed on top of the control layer and coupled to the control layer, wherein the second antiferromagnetic layer is magnetically biased in the same direction as the first antiferromagnetic layer; and
wherein the interlayer coupling field canceling structure has a cancelling magnetic field pinned anti-parallel the magnetic field of the pinned magnetic structure.

20. The sensor structure of claim 19, wherein the spacer layer is one of chromium, ruthenium, or copper.

21. The sensor structure of claim 20, wherein the spacer layer is between 5 Angstroms and 12 Angstroms thick.

22. The sensor structure of claim 19, wherein the interlayer coupling field canceling structure opposes an interlayer coupling field between the free layer and the pinned magnetic structure.

* * * * *

UNITED STATES PATENT AND TRADEMARK OFFICE
CERTIFICATE OF CORRECTION

| | | |
|---|---|---|
| PATENT NO. | : 9,099,120 B1 | Page 1 of 1 |
| APPLICATION NO. | : 14/248970 | |
| DATED | : August 4, 2015 | |
| INVENTOR(S) | : Freitag et al. | |

It is certified that error appears in the above-identified patent and that said Letters Patent is hereby corrected as shown below:

Specification

In Detailed Description:

Column 7, Line 54, please delete "micron/88%" and insert --$micron^2$/88%-- therefor;

Column 9, Line 24, please delete "A" and insert --Å-- therefor.

Signed and Sealed this
Second Day of February, 2016

Michelle K. Lee
*Director of the United States Patent and Trademark Office*